United States Patent
Yano et al.

(10) Patent No.: US 8,659,950 B1
(45) Date of Patent: Feb. 25, 2014

(54) SEMICONDUCTOR MEMORY DEVICE

(71) Applicant: Winbond Electronics Corp., Taichung (TW)

(72) Inventors: Masaru Yano, Tokyo (JP); Lu-Ping Chiang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/902,863

(22) Filed: May 27, 2013

(30) Foreign Application Priority Data

Aug. 30, 2012 (JP) .................................. 2012-189479

(51) Int. Cl.
*G11C 16/06* (2006.01)
(52) U.S. Cl.
USPC .................................. 365/185.21; 365/185.01
(58) Field of Classification Search
USPC ........................ 365/185.01–185.33
See application file for complete search history.

(56) References Cited

U.S. PATENT DOCUMENTS

| | | | | |
|---|---|---|---|---|
| 5,075,890 A | * | 12/1991 | Itoh et al. ................. | 365/185.17 |
| 5,592,419 A | * | 1/1997 | Akaogi et al. ........... | 365/185.18 |
| 5,608,670 A | * | 3/1997 | Akaogi et al. ........... | 365/185.23 |
| 5,774,397 A | * | 6/1998 | Endoh et al. ............. | 365/185.19 |
| 5,828,621 A | * | 10/1998 | Tanzawa et al. .............. | 365/229 |

FOREIGN PATENT DOCUMENTS

JP    H11176177    7/1999

* cited by examiner

*Primary Examiner* — Harry W Byrne
(74) *Attorney, Agent, or Firm* — Jianq Chyun IP Office (57) ABSTRACT

A semiconductor memory device performing high speed reading with a miniaturized sensing circuit is provided. A pre-charge voltage from a virtual potential VPRE' is provided to an odd bit line when an even bit line is selected, the pre-charge voltage is provided from a source voltage supply unit 230 to a shared odd source line SL_o, a ground potential is provided from the source voltage supply unit 230 to an even source line SL_e.

6 Claims, 7 Drawing Sheets

| Mode | SL_e | SL_o | GBL-e ("0") | GBL-e ("1") | GBL-o |
|---|---|---|---|---|---|
| Read | 0v | VBL (1.1v) | VBL | VBL (0.2 $\mu$A) | VBL |
| R-Read | Vdd | VBL | 0->F | 0->F->>VBL | VBL |
| Pgm | Vdd | Vdd | 0v | Vdd | Vdd |
| Erase | F | F | F | F | F |

Selected: even number bit line (SL_e, GBL_e)
Unselected: odd number bit line (SL_o, GBL_o)
R-Read (erase verification)
F: floating
VBL: bit line potential

SEMICONDUCTOR MEMORY DEVICE

CROSS-REFERENCE TO RELATED APPLICATION

This application claims the priority benefit of Japan application serial no. 2012-189479, filed on Aug. 30, 2012. The entirety of the above-mentioned patent application is hereby incorporated by reference herein and made a part of this specification.

TECHNICAL FIELD

The disclosure relates to a semiconductor memory device, and particularly relates to a semiconductor memory device of bit line selection of a NAND-type flash memory.

BACKGROUND

[Patent Document 1] JP11-176177

A NAND-type flash memory is formed of a memory array with a plurality of NAND series configured as matrix. The NAND series are formed of a plurality of memory cells coupled in series and selection transistors coupled to two ends of the NAND series, wherein one end is coupled with a bit line through the selection transistor, and another end is coupled to a source line through the selection transistor. Reading and programming (writing in) of a data is performed by the bit line coupled with the NAND series.

Figure 1:
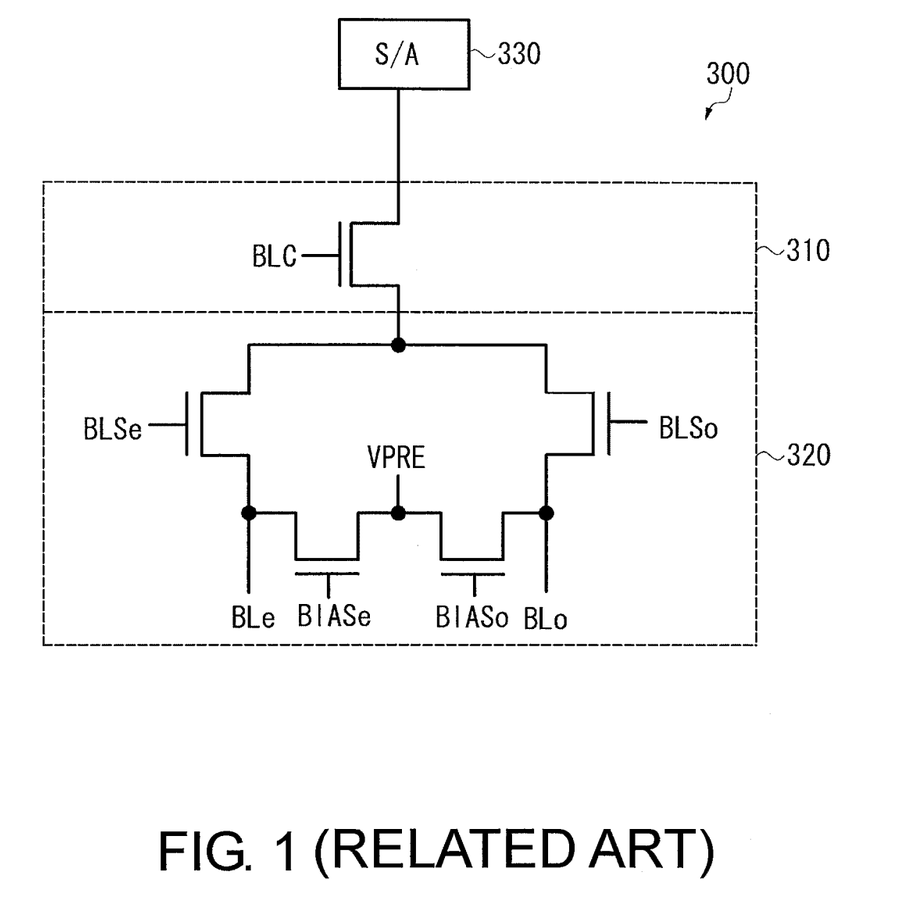
FIG. 1 is a structural schematic diagram illustrating a bit line selection circuit of a conventional flash memory.

FIG. 1 is a schematic diagram illustrating a bit line selection circuit of a conventional flash memory. An even number bit line BLe and an odd number bit line BLo in FIG. 1 are a pair of bit lines. A bit line selection circuit 300 has a first selection unit 310 including a transistor BLC that couples the even number bit line BLe or the odd number bit line BLo with a sensing amplifier 330 (S/A), transistors BIASe and BIASo selectively applying a bias voltage VPRE to the even number bit line BLe and odd number bit line BLo, and a second selection unit 320 including transistors BLSe and BLSo that couple the even number bit line BLe and odd number bit line BLo with the first selection unit 310.

To pre-charge a write-in disable bit line to a prescribed bias voltage when performing a programming operation or pre-charge all of the bit lines to an erasing voltage to apply the erasing voltage to a cell well when performing an erasing operation, the bias voltage transistors BIASe and BIASo and the selection transistors BLSe and BLSo of the second selection unit 320 are formed of high voltage transistors having a thick gate oxidation film and a long gate.

When a page is read from the flash memory, a page formed by the even number bit line (hereinafter "even number page" for simplicity) or a page formed by the odd number bit line (hereinafter "odd number page" for simplicity) are alternately read for reading. When the even number page is selected, the even number page is coupled to the sensing amplifier to be read. Meanwhile, the unselected odd number page is separated by the sensing amplifier and is supplied with a shielding potential equivalent to a ground level (0V), thereby reducing noise through capacitance coupling between the adjacent bit lines. This is the so-called bit-line shielding (Patent Document 1).

The sensing amplifier includes a sensing circuit sensing a voltage or current read from the bit line, a latch circuit preserving data or writing in data, etc. The sensing circuit/latch circuit of the sensing amplifier are selectively shared by an even number bit line and an odd number bit line. Therefore, the sensing amplifier has a sensing circuit/latch circuit for one page, whereas a word line on the memory array is coupled to memory cells for two pages (even and odd number pages). A sensing circuit/latch circuit allocates two bit lines (even number bit line and odd number bit line). Given that the even and odd number pages are alternately read, although the word line has a two-page structure, two pages are not simultaneously read. Therefore, it is inevitable that a high-speed effect cannot be arrived at. Programming is also performed with the even number page or odd number page as a unit.

One further development is that a pair of sensing amplifiers is disposed at two sides of a memory array, wherein one of the sensing amplifiers is coupled to the even number bit line, and the other of the sensing amplifier is coupled to the odd number bit line. In addition, a sensing circuit/latch circuit is distributed to a bit line, such that the flash memory is allowed to read or program two pages, even number page and odd number page, at the same time.

However, in this kind of flash memory, since the even number bit line end and the odd number bit line end are driven by respective of the sensing amplifiers, a capacitance for a bit line increases as a number of word lines increases due to higher density, and the demand to the driving ability of the sensing amplifier consequently increases. To improve the driving ability of the sensing amplifier, a higher voltage and a transistor in a relatively larger size become necessary. Therefore, the sensing amplifier disposed at two sides of the memory cells become less preferable in terms of spatial utilization.

Moreover, in the flash memory in which reading and programming is performed by alternately performing the operation to the even number page or odd number page, the technology of bit line shielding may be replaced to improve a data-reading speed from the memory array. Since there are fewer sensing amplifiers, it has the advantage of a higher integration of memory.

SUMMARY

The disclosure provides a semiconductor memory device performing high speed reading with a miniaturized sensing circuit.

The disclosure further provides a semiconductor memory device that may replace the conventional bit line shielding for reading and programming.

The semiconductor memory device of the disclosure includes a memory array formed by a plurality of memory cell units configured as a matrix, wherein each of the memory cell units is formed by a plurality of electronic rewritable memory elements coupled in series; a bit line coupled with a drain side of the memory cell units; a first source line coupled to a source side of even number memory cell units of the memory cell units, a second source line coupled to a source side of odd number memory cell units of the memory cell units, a row selection circuit selecting memory elements in a row direction of the memory elements in the memory cell units, a first selection circuit selecting an even number bit line or an odd number bit line coupled to a sensing circuit, a second selection circuit selecting the even number bit line or the odd number bit line coupled to a voltage supply, and a source voltage supply circuit supplying voltage to the first source line and the second source line. When the even number bit line is selected by the first selection circuit, the odd number bit line is selected by the second selection circuit, when the odd number bit line is selected by the first selection circuit, the even number bit line is selected by the second selection circuit. When the even number bit line is selected by the first selection circuit, a first voltage from the sensing circuit is supplied to the even number bit line, a reference voltage is supplied to the first source line by the source voltage supply circuit, a second voltage from the voltage supply is supplied to the odd number bit line, a third voltage is supplied to the second source line by the source voltage supply circuit, and the third voltage is equal to the second voltage. When the odd number bit line is selected by the first selection circuit, the first voltage from the sensing circuit is supplied to the odd number bit line, the reference voltage is supplied to the second source line by the source voltage supply circuit, the second voltage from the voltage supply is supplied to the even number bit line, and the third voltage is supplied to the first source line by the source voltage supply circuit.

Based on the disclosure, since the memory cell units coupled with the selected even number bit line and odd number bit line are operated at the sensing amplifier circuit side and the source line side, the pre-charge time of the bit line or the pre-charge time of the memory cell units is reduced. Meanwhile, since the sensing amplifier circuit is commonly used by the even number bit line and the odd number bit line, the sensing amplifier circuit may be disposed at one side of the memory array, so as to reduce the increase in the space taken. In the disclosure, given that a reading operation is performed, since a potential of the unselected bit line is fixed, the noise caused by capacitance coupling of adjacent bit lines may also be reduced even if the unselected bit line is not discharged to the ground level as the conventional bit line shielding teaches. Furthermore, since the unselected bit line is already charged, no further time is consumed to charge the bit line when the unselected bit line is subsequently read. Therefore, a higher reading speed and lower power consumption are achieved.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

The embodiments of the disclosure are described in detail with reference to the accompanying drawings in the following. The disclosure takes NAND flash memory as an example and uses NAND flash memory as a preferred embodying configuration. In addition, for the ease of understanding, units in the disclosure are illustrated with emphasis. It should be noted that a proportion of the units illustrated herein is different from a proportion in a device in real practice.

Figure 2:
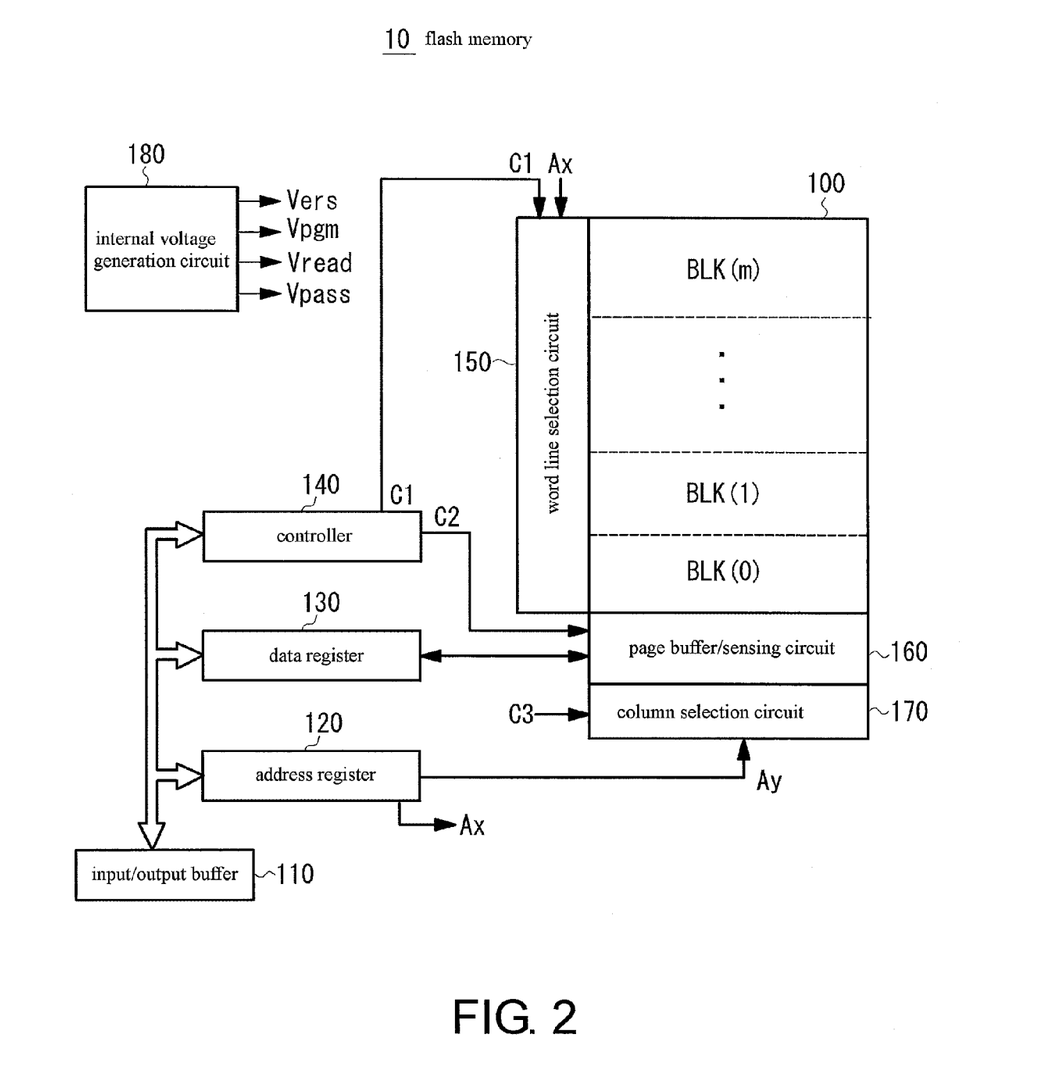
FIG. 2 is a block diagram illustrating a structure of a flash memory according to an embodiment of the disclosure.

FIG. 2 illustrates a block diagram of a typical flash memory. A structure of the flash memory illustrated here only serves as an exemplary embodiment. The disclosure is not limited to the structure.

A flash memory 10 of this embodiment includes a memory array 100 having a plurality of memory cells configured as a matrix, an input/output buffer 110 coupled to an external input/output terminal I/O to preserve an input/output data, an address register 120 receiving an address data from the input/output buffer 110, a data register 130 that preserves the input/output data, a controller 140 supplying control signals C1, C2, C3, etc., to control each unit based on a command data from the input/output buffer 110 and an external control signal, a word line selection. circuit 150 decoding a row address information Ax from the address register 120 and performs a block selection and word line selection according to an outcome of decoding, a page buffer/sensing circuit 160 preserving a data read out through the word line selection circuit 150 from a selected page and writing in a write-in data of the selected page, a column selection circuit 170 decoding a column address information Ay from the address register 120 and selecting a column data in the page buffer according to an outcome of decoding, and an internal voltage generation circuit 180 generating voltages necessary for reading, programming and erasing data (e.g. programming voltage Vpgm, passing voltage VPass, reading voltage Vread, and erasing voltage Vers).

Figure 3:
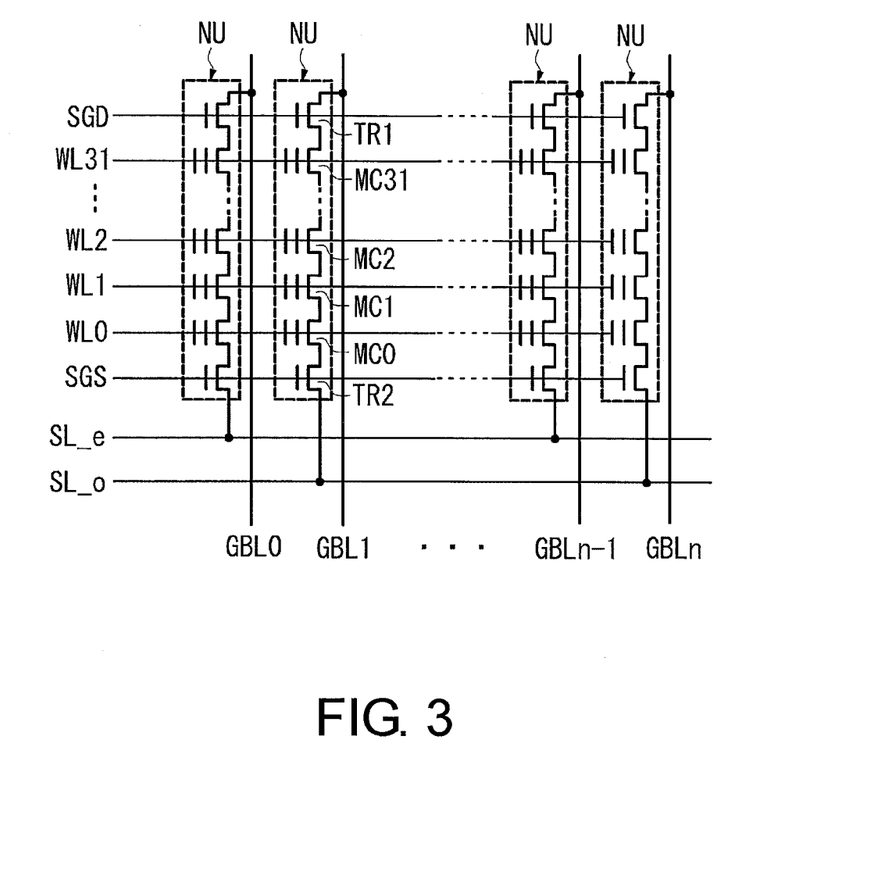
FIG. 3 is a schematic circuit diagram illustrating a structure of a NAND series according to an embodiment of the disclosure.

The memory array 100 has memory blocks from BLK(0), BLK(1), to BLK(m) configured along a column direction. FIG. 3 illustrates a circuit diagram of a structure of a NAND series formed in a memory block. In a memory block, a plurality of NAND series (hereinafter memory cell units NU), wherein memory cells are connected in series, are formed. The memory cell units NU are configured along a row direction. In FIG. 3, n+1 of the memory cell units NU are arranged along the row direction in the memory block.

A structure of the memory cell units NU includes a plurality of memory cells MCi (i=0, 1, . . . 31) coupled in series, a selection transistor TR1 coupled with a drain side of the memory cell MC31 at one end of the memory cell units NU, and a selection transistor TR2 coupled with a source side of the memory cell MC0 at another end of the memory cell units NU. It should be noted that a drain of the selection transistor TR1 is correspondingly coupled to a bit line GBL, and a source of the selection transistor TR2 of the even number memory cell units NU is coupled to a shared even number source line SL_e, whereas a source of the selection transistor TR2 of the odd number memory cell units NU is coupled to a shared odd number source line SL_o.

Control gates of the memory cells MCi are coupled to word lines WLi, gates of the selection transistors TR1 and TR2 are coupled to selection gate lines SGD and SGS parallel to the word line WLi. When the word line selection circuit 150 selects a memory block according to the row address information Ax, the selection transistors TR1 and TR2 are selectively driven with the selection gate lines SGS and SGD of the memory block.

Typically, the memory cells have a metal oxide semiconductor (MOS) transistor that includes the following components. The MOS transistor includes a source/drain forming a N-type diffusion area, a tunnel oxidation film formed on a tunnel between the source/drain, a floating grid formed on the tunnel oxidation film and accumulating charges (charge accumulation layer), a control gate formed on the floating grid through a dielectric film.

When the floating grid is not accumulated with charges, namely a data "1" is preserved or erased, a threshold value is in a negative state, and the memory cells are in a state of "normally on". When the floating grid is accumulated with charges, namely a data "0" is written in, the threshold value is converted into a positive state, and the memory cells are in a state of "normally off".

The bit lines GBL0, GBL1 . . . GBLn coupled with the memory cells NU are coupled to the page buffer/sensing circuit 160 through a bit line selection circuit. When the bit line selection circuit is reading and programming, an even number bit line or an odd number bit line is selected. In addition, the selected even number bit line or odd number bit line is coupled to the page buffer/sensing circuit 160.

Figure 4:
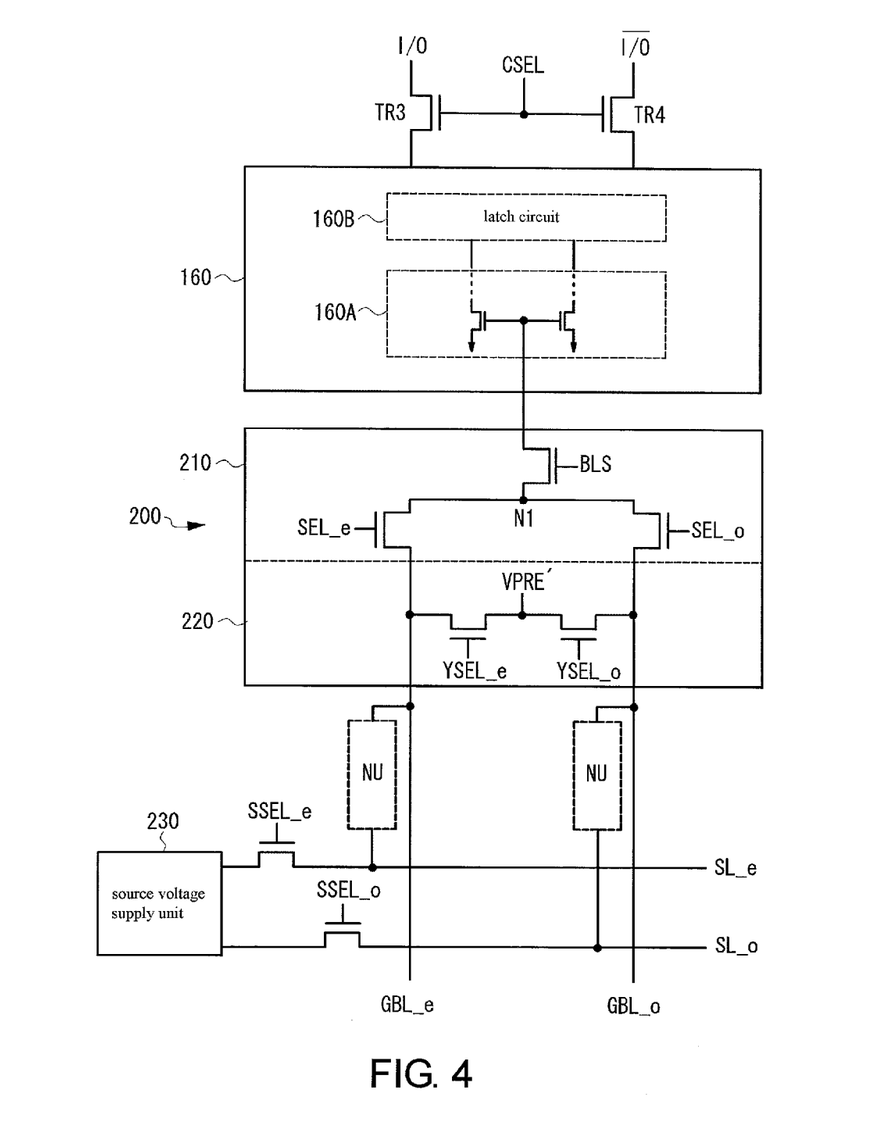
FIG. 4 is a schematic diagram illustrating a relation between a shared even number source line, a shared odd number source line, and a NAND series according to this embodiment.

FIG. 4 is a specific circuit structure illustrating the memory array and page buffer/sensing circuit for illustrating this embodiment. Here, the even number bit line GBL_e and the odd number bit line GBL_o exemplarily serve as a pair of bit lines. The page buffer/sensing circuit 160 are commonly used by the pair of even number bit line GBL_e and odd number bit line GBL_o. Given that an even number bit line and an odd number bit line coupled with a word line respectively form a page, the page buffer/sensing circuit 160 includes one the page buffer/sensing circuit 160 for one page.

The page buffer/sensing circuit 160 includes a sensing amplifier 160A that senses a potential of the even number bit line GBL_e or odd number bit line GBL_o when reading, and a latch circuit 160B that preserves a data being read out or programmed. The page buffer/sensing circuit 160 is further coupled to the input/output terminal I/O, $\overline{I/O}$ or the data register 130 through a pair of MOS transistors TR3 and TR4. Gates of the transistors TR3 and TR4 are coupled to a column selection gate line CSEL from the column selection circuit 170. By opening the transistors TR3 and TR4, a programming data from the input/output terminal I/O, $\overline{I/O}$ or the data register 130 is input to the latch circuit 160B. Alternatively, a read data preserved by the latch circuit 160B is transmitted to the input/out terminal I/O, $\overline{I/O}$ or the data register 130.

A structure of a bit line selection circuit 200 includes a first selection unit 210 that couples the even number bit line GBL_e and odd number bit line GBL_o to the page buffer/sensing circuit 160, and a second selection unit 220 that applies a prescribed bias voltage to the even number bit line GBL_e and the odd number bit line GBL_o.

The first selection unit 210 includes an even number selection transistor SEL_e coupled to the even number bit line GBL_e, an odd number selection transistor SEL_o coupled to the odd number bit line GBL_o, and a bit line selection transistor BLS coupled between a shared node N1 of the even number selection transistor SEL_e and the odd number selection transistor SEL_o and the page buffer/sensing circuit 160. The transistors SEL_e, SEL_o, and BLS forming the first selection unit 210 are N-type MOS transistors and form high voltage transistors that operate under a high voltage (HV) in a P-type well in a peripheral circuit that forms the page buffer/sensing circuit 160, etc.

Gates of the even number selection transistor SEL_e, the odd number selection transistor SEL_o, and the bit line selection transistor BLS are applied with the control signal from the controller 140. The transistors are selectively driven when reading, programming, and erasing. For example, given that reading of a selected page is performed, and the even number bit line GBL_e is selected, the odd number bit line GBL_o is not selected, the even number selection transistor SEL_e, the bit line selection transistor BLS are in an on-state, whereas the odd number selection transistor SEL_o is in an off-state. In addition, when the odd number bit line GBL_o is selected, the even number bit line GBL_e is not selected, the odd number transistor SEL_o and the bit line selection transistor BLS are in the on-state, whereas the even number selection transistor SEL_e is in the off-state. In this way, one sensing amplifier 160A and one latch circuit 160B of one page buffer/sensing circuit 160 are commonly used by two bit lines GBL_e and GBL_o.

The second selection unit 220 includes an even number bias voltage selection transistor YSEL_e coupled between the even number bit line GBL_e and a virtual potential VPRE' and an odd number bias voltage selection transistor YSEL_o coupled between the odd number bit line GBL_o and the virtual potential VPRE'. The even number bias voltage selection transistor YSEL_e and the odd number bias voltage selection transistor YSEL_o are formed of N-type MOS transistors and are preferably formed in a P-type well forming a memory cell unit or memory block. The transistors that form the second selection unit 220 and the transistors that form the first selection unit 210 are different. The transistors that form the second selection unit 220 are low voltage transistors that operate under a low voltage (LV).

Gates of the even number bias voltage selection transistor YSEL_e and the odd number bias voltage selection transistor YSEL_o are applied with the control signal from the controller 140. The transistors are selectively driven when reading, programming, and erasing. In addition, under control of the controller 140, a variety of bias or pre-charge voltages reacting to operation states from the internal voltage generation circuit 180 are supplied to the virtual potential VPRE'. For example, given that a page is being read, and when the even number bit line GBL_e is selected, whereas the odd number bit line GBL_o is not selected, the even number bias voltage transistor YSEL_e is in the off-state, whereas the odd number bias voltage transistor YSEL_o is in the on-state. A pre-charge potential is supplied to the odd number bit line GBL_o through the virtual potential VPRE'. In addition, when the even number bit line GBL_e is not selected, and the odd number bit line GBL_o is selected, the even number bias voltage transistor YSEL_e is in the on-state, whereas the odd number bias voltage transistor YSEL_o is in the off-state. The pre-charge potential is supplied to the even number bit line GBL_e through the virtual potential VPRE'. When programming, a programming disable voltage (a voltage to be able to inhibit programming cell) is provided to the virtual potential VPRE'. A tunnel of memory cells of a bit line that is not selected is biased to a write-in disable voltage (un-selected local bit-lines are charged or biased a level to be able not to program) or to be pre-charged.

A characteristic of this embodiment is that given that a page is being read, and when the even number bit line or an even number page is selected, the pre-charge voltage from the page buffer/sensing circuit 160 is supplied to one end of the even number bit line GBL_e through the bit line selection transistor BLS and the even number selection transistor SEL_e. Meanwhile, the pre-charge voltage from the virtual potential VPRE' is supplied to one end of the odd number bit line GBL_o through the odd number selection transistor YSEL_o.

Moreover, as previously described, the source of the selection transistor TR2 at the source side of the even number memory cell units NU is coupled to the shared even number source line SL_e, whereas the source of the selection transistor TR2 at the source side of the odd number memory cell units NU is coupled to the shared odd number source line SL_o. The shared even number source line SL_e is coupled to a source voltage supply unit 230 through an even number source line selection transistor SSLE_e, whereas the shared odd source line SL_o is coupled to the source voltage supply unit 230 through an odd number source line selection transistor SSEL_o. Under control of the controller 140, the source voltage supply unit 230 supplies voltages reacting to the operation states to the shared even number source line SL_e and the shared odd number source line SL_o.

Figure 5:
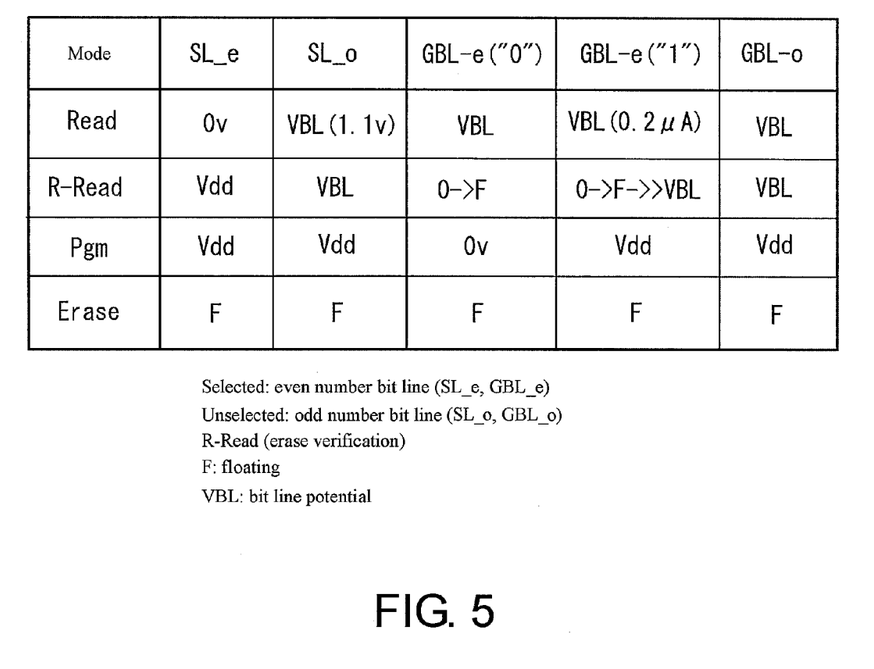
FIG. 5 is a schematic diagram illustrating a relation between voltages of units when a flash memory is in different operation modes according to an embodiment of the disclosure.

FIG. 5 is a schematic diagram illustrating a relation between voltages of units when a flash memory is in different operation modes according to this embodiment. In an example illustrated herein, the even number bit line GBL_e and the shared even number source line SL_e are selected, whereas the odd number bit line GBL_o and the shared odd number source line SL_o are not selected.

When performing a reading operation, the selected even number bit line GBL_e is supplied with the pre-charge voltage (e.g. 1.1V) through the page buffer/sensing circuit 160, and the shared even number source line SL_e is supplied with 0V through the even number source line selection transistor SSEL_e. In addition, the unselected odd number bit line GBL_o is supplied with the pre-charge voltage (e.g. 1.1V) through the virtual potential VPRE', and the shared odd number source line SL_o is supplied with the pre-charge voltage (e.g. 1.1V) through the source voltage supply unit 230.

Afterward, selection of memory block and word line is performed by the word line selection circuit 150. The selection transistors TR1 and TR2 are activated, a selected word line is applied with 0V, and an unselected word line is applied with 4.5V (Vread). If the selected memory cell preserves the data "1", since the selected memory cell is in a conductive state, a current with approximately 0.2 µA flows from the even number bit line GBL_e to the shared even number source line SL_e, which may be detected by the sensing amplifier 160A. If the selected memory cell preserves the data "0", since the selected memory cell is in a non-conductive state, there is no current flowing from the even number bit line GBL_e to the shared even number source line SL_e, which may also be detected by the sensing amplifier 160A.

One end (drain side) of the unselected odd number memory cell units NU is supplied with the pre-charge voltage from the virtual potential VPRE' through the odd number bit line GBL_o, whereas another end (source side) is supplied with the pre-charge voltage through the shared odd number source line SL_o. If there is no memory cell with the data "0" in the memory cell units NU, the memory cell units NU are in the conductive state, and all of the memory cell units NU are in a state with the pre-charge voltage. Even if there is the data "0" in the memory cell units NU, since the pre-charge voltage is supplied from the drain side and the source side, the memory cell units NU may be considered to be in the state with the pre-charge voltage. In this way, a bit line potential VBL of the odd number bit line GBL_o is set at the pre-charge voltage. Thereby, when the selected even number bit line GBL_e is performing a reading operation, an influence may be not be rendered due to capacitance coupling with the adjacent odd number bit line.

After the even number bit line GBL_e finishes reading, the odd number bit line GBL_e is subsequently selected. At this time, since the odd number bit line GBL_o is already at the pre-charge voltage, the page buffer/sensing circuit 160 hardly consumes any power to charge the odd number bit line GBL_o, thereby reducing a re-charging time. Moreover, a charge voltage of the shared odd number source line SL_o is discharged to a ground level through the odd number source line selection transistor SSEL_o. In addition, the shared even number source line SL_e is supplied with the pre-charge voltage through the even number source line selection transistor SSEL_e.

Further description with respect to a verification (R-Read) operation after erasing is provided hereinafter. After a batch size deletion of memory cells with block as a unit, the potential of the even number bit line GBL_e is discharged to 0V. Then the even number selection transistor SEL_e is turned off, such that the even number bit line GBL_e is in a floating state. Afterward, a power voltage vdd is supplied to the shared even number source line SL_e by the source voltage supply unit 230 through the even number source line selection transistor SSEL_e. Then, the even number selection transistor SEL_e is turned on, and verification sensing to the even number bit line GBL_e is performed by the sensing circuit 160. If all of the memory cells are erased (if data "1" is preserved), since the even number bit line GBL_e is charged with the power voltage Vdd, the even number bit line GBL_e may be detected with a current over a predetermined value or a voltage over the reference voltage. If a portion of the memory cells are not completely erased, since the memory cells are in the non-conductive state, and the even number bit line GBL_e is in the floating state, the sensing circuit 160 may not detect a current or detect a voltage below the reference voltage. The same applies to the odd number bit line GBL_o.

In programming (Pgm), given that the even number bit line GBL_e is selected, the power voltage Vdd is applied to the shared even number source line SSL_e and the shared odd number source line SL_o, the even number bit line GBL_e with the data "0" written in is applied with 0V through the sensing circuit 160, and the write-in disable even number bit line GBL_e is supplied with the power voltage Vdd. Additionally, in erasing (Erase), the units shown in FIG. 5 are set to be in the floating state, and the P-type well is applied with a voltage of approximately 20V. Programming and erasing operations described herein are not particularly different from the conventional operations.

Figure 6:
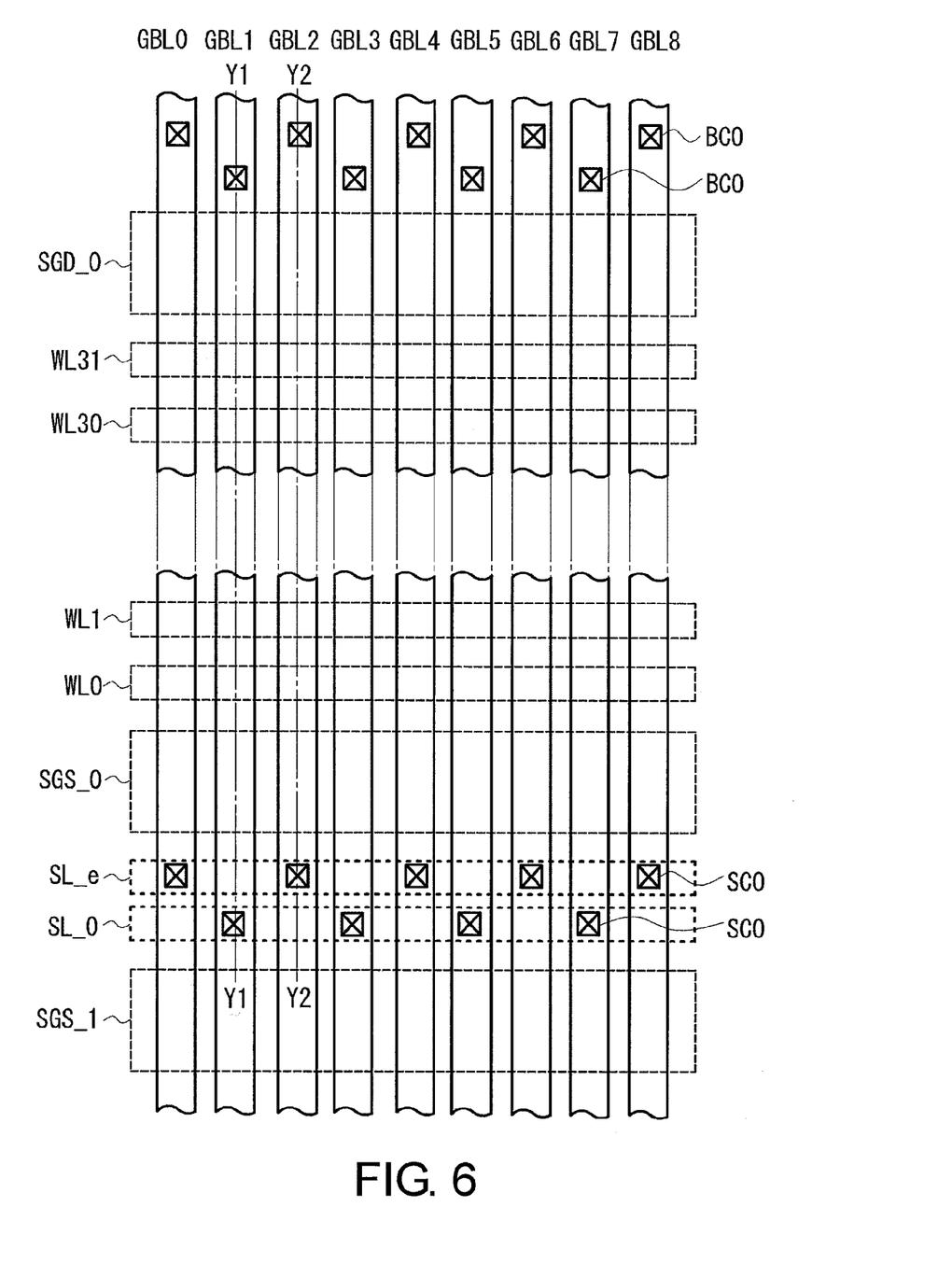
FIG. 6 is a schematic planar diagram illustrating a layout of a NAND series, a shared even number source line, and a shared odd number source line according to an embodiment of the disclosure.
Figure 7:
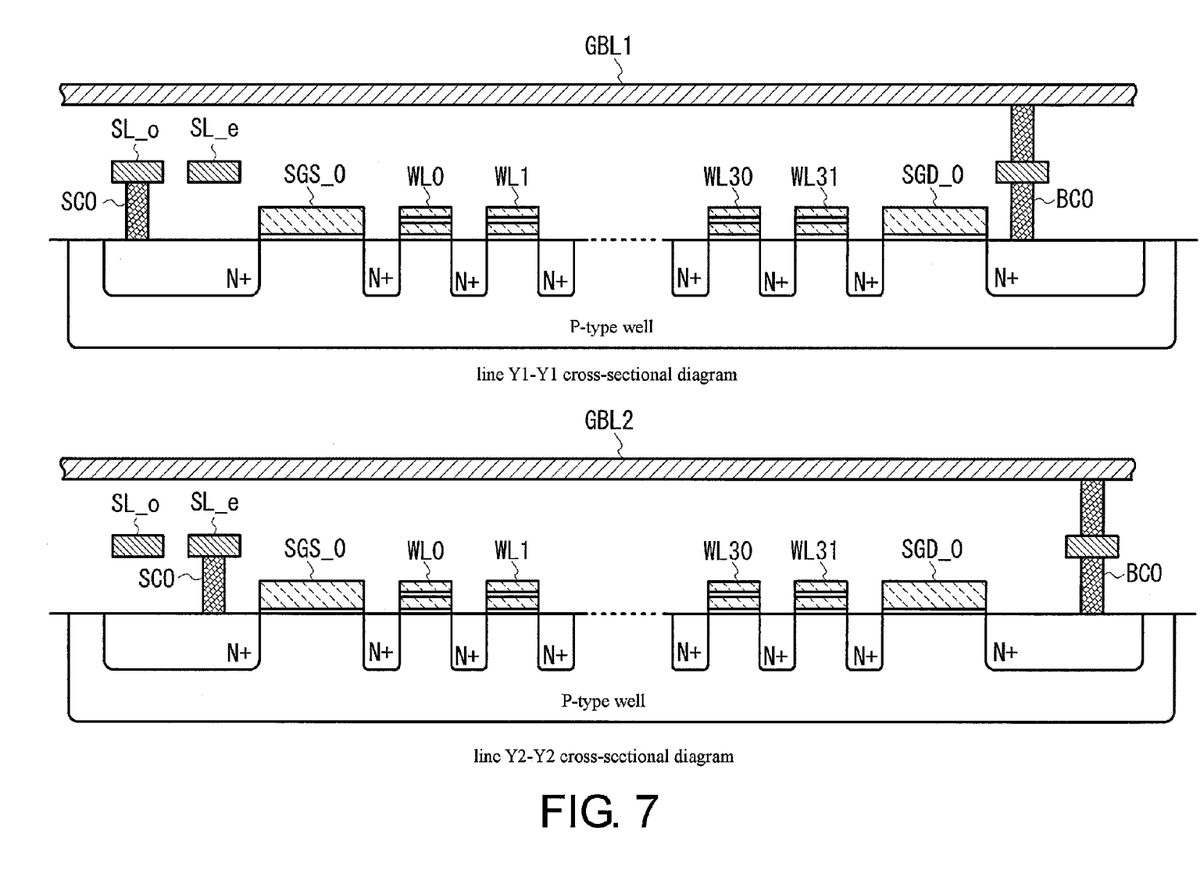
FIG. 7 are cross-sectional diagrams along line Y1-Y1 and line Y2-Y2 of the layout illustrated in FIG. 6.

FIG. 6 illustrates a layout schematic diagram of a memory array according to an embodiment of the disclosure, and FIG. 7 are cross-sectional diagrams along line Y1-Y1 and line Y2-Y2 in FIG. 6. Here, only 8 bits of bit lines GBL0-GBL8 are illustrated. In a preferred configuration, the memory array 100 may be formed in a P-type well formed in a N-type well or a N-type silicon semiconductor substrate. To allow batch size erasing of the memory blocks with block as a unit, a memory block is formed in a P-type well. The memory cell units NU are separated by an insulating trench extending along the column direction, thereby defining an active area. In the active area, two layers of polysilicon layers extending along the row direction form word lines WL0-WL31. Moreover, a selection gate line SGD_0 of the selection transistor TR1 adjacent to the word line WL31 and extending along the row direction is formed, and a selection gate line SGS_1 of the selection transistor TR2 adjacent to the word line WL0 and extending along the row direction is formed.

After forming the memory cells and selection transistors, an inter-layer insulation film is formed. A N+ source area of the selection transistor TR2 (selection gate line SGD_0) is coupled with the shared even number source line SL_e and the shared odd number source line SL_o through a source contact SCO.

In a preferred embodiment, the source contact SCO of the shared even number source line SL_e and the shared odd number source line SL_o is formed in the inter-layer insulation film in an alternating or interleaving arrangement. Thereby, the shared even number source line SL_e and the shared odd number source line SL_o extend along the row direction and parallel to each other. The shared even number source line SL_e and the shared odd number source line SL_o may be formed of a metal layer (Metal-1) made of aluminum (Al), copper (Cu), etc.

In addition, a N+ drain area of the selection transistor TR1 (selection gate line SGD_0) is coupled to the even number bit line GBL_e or the odd number bit line GBL_o through a bit contact BCO. The even number bit line GBL_e and the odd number bit line GBL_o extend along the column direction on the memory cells. In addition, the even number bit line GBL_e and the odd number bit line GBL_o are formed of a metal layer (Metal-2) made of aluminum (Al), copper (Cu), etc.

As illustrated in FIG. 6, before forming metal wiring of the metal layers Metal-1 and Metal-2, the bit contact BCO and the source contact SCO may be formed in a symmetrical or identical arrangement. In this way, a photomask pattern that forms a contact may be shared. Given that the shared even number source line SL_e and the shared odd number source line SL_o are formed at the bit contact BCO side, a contact of the even number bit line GBL_e and the odd number bit line GBL_o may be formed at the source contact SCO side.

Although the embodiments above describe in detail the preferred embodiments of the disclosure, the embodiments are not intended to limit the disclosure into a specific embodying configuration. Various modifications and variations can still be made without departing from the scope or spirit of the disclosure defined in the claims below.

In the embodiments above, given that a page is read, although the source voltage supply unit 230 supplies a voltage equivalent to the pre-charge voltage from the page buffer/sensing circuit 160 and the virtual potential VPRE' to the even number source line or odd number source line, the voltage supplied by the source voltage supply unit 230 may also be modified as long as a reading operation is not affected. In addition, although only one memory array 100 is described as an example in the embodiments above, the flash memory may also have a plurality of memory arrays.

What is claimed is:

1. A semiconductor memory device, comprising:
    a memory array, formed by a plurality of memory cell units configured as a matrix, wherein each of the memory cell units is formed by a plurality of electronic rewritable memory elements coupled in series;
    a bit line, coupled to a drain side of the memory cell units;
    a first source line, coupled to a source side of even number memory cell units of the memory cell units;
    a second source line, coupled to a source side of odd number memory cell units of the memory cell units;
    a row selection circuit, selecting memory elements in a row direction of the memory elements in the memory cell units;
    a first selection circuit, selecting an even number bit line or an odd number bit line coupled to a sensing circuit;
    a second selection circuit, selecting the even number bit line or the odd number bit line coupled to a voltage supply; and
    a source voltage supply circuit, supplying voltage to the first source line and the second source line,
    wherein when the even number bit line is selected by the first selection circuit, the odd number bit line is selected by the second selection circuit, when the odd number bit line is selected by the first selection circuit, the even number bit line is selected by the second selection circuit,
    when the even number bit line is selected by the first selection circuit, a first voltage from the sensing circuit is supplied to the even number bit line, a reference voltage is supplied to the first source line by the source voltage supply circuit, a second voltage from the voltage supply is supplied to the odd number bit line, a third voltage is supplied to the second source line by the source voltage supply circuit, and the third voltage is equal to the second voltage,
    when the odd number bit line is selected by the first selection circuit, the first voltage from the sensing circuit is supplied to the odd number bit line, the reference voltage is supplied to the second source line by the source voltage supply circuit, the second voltage from the voltage supply is supplied to the even number bit line, and the third voltage is supplied to the first source line by the source voltage supply circuit.

2. The semiconductor memory device as claimed in claim 1, wherein the first voltage is equal to the second voltage.

3. The semiconductor memory device as claimed in claim 1, wherein the second voltage is a pre-charge voltage.

4. The semiconductor memory device as claimed in claim 1, wherein a contact area of the first source line and a contact area of the second source line are configured in an interleaving manner, and the first and second source lines comprise a portion that the first and second source lines extend along a direction that the first and second source lines are parallel to each other.

5. The semiconductor memory device as claimed in claim 1, wherein in a pattern arrangement of a contact area of the first source line and a contact area of the second source line, a contact area of the even number bit line and a contact area of the odd number bit line have an identical pattern arrangement.

6. The semiconductor memory device as claimed in claim 1, wherein the first source line and the second source line are lower-layer metal wiring, and the even number bit line and the odd number bit line are upper-layer metal wiring.

* * * * *